United States Patent
Fischer et al.

[11] Patent Number: 5,976,974
[45] Date of Patent: Nov. 2, 1999

[54] METHOD OF FORMING REDUNDANT SIGNAL TRACES AND CORRESPONDING ELECTRONIC COMPONENTS

[75] Inventors: Paul J. Fischer; Robin E. Gorrell, both of Eau Claire, Wis.

[73] Assignee: W. L. Gore & Associates, Inc., Newark, Del.

[21] Appl. No.: 08/847,374

[22] Filed: Apr. 22, 1997

[51] Int. Cl.⁶ ..................................................... H01L 21/44
[52] U.S. Cl. .......................... 438/667; 438/129; 438/598; 438/599
[58] Field of Search ................................. 438/667, 51, 55, 438/106, 118, 129, 598, 599

[56] References Cited

U.S. PATENT DOCUMENTS

| | | | |
|---|---|---|---|
| 4,964,212 | 10/1990 | Deroux-Dauphin et al. | 438/667 |
| 4,978,639 | 12/1990 | Hua et al. | 438/667 |
| 5,106,461 | 4/1992 | Volfson et al. | 438/667 |

OTHER PUBLICATIONS

Tummala, R. et al. editors, Microelectronics Packaging Handbook, Semiconductor Packaging, Part II, Second Edition, pp. II–63, II–64, and II–117 (1997).

*Primary Examiner*—John F. Niebling
*Assistant Examiner*—Lynne A. Gurley
*Attorney, Agent, or Firm*—Victor M. Genco, Jr.

[57] ABSTRACT

In a method for forming redundant signal traces and corresponding electronic components, a photoresist pattern which defines a semi-additive signal image is coated on at least one first conductive layer of a composite base substrate. A barrier layer of etch-resistant metal is deposited on the first conductive layer. The photoresist is removed, thereby forming a first barrier signal trace having a first line width. Optionally, one or more vias may be formed in the substrate. A surface conductive layer is deposited on the first conductive layer, the barrier layer, and on a surface of the optional vias. A photoresist pattern is coated on the surface conductive layer which defines a subtractive signal image. Predetermined portions of the surface conductive layer and the first conductive layer are removed. The photoresist is removed forming a second signal trace in overlying relationship with the first barrier signal trace and having a second line width greater than the first line width.

7 Claims, 5 Drawing Sheets

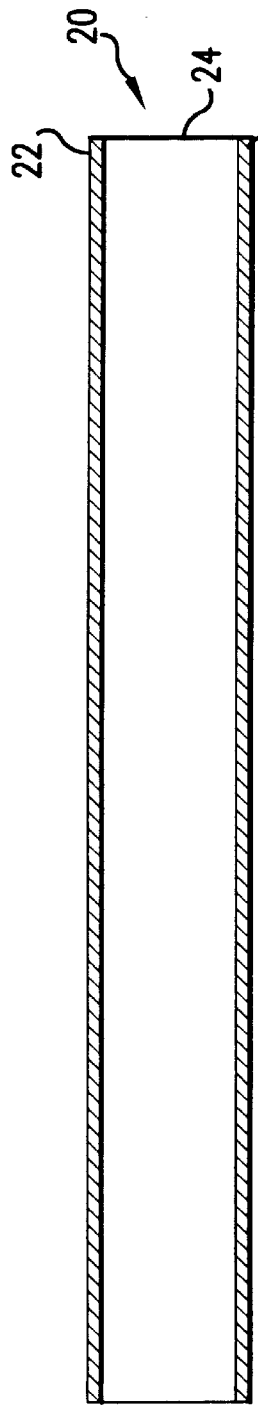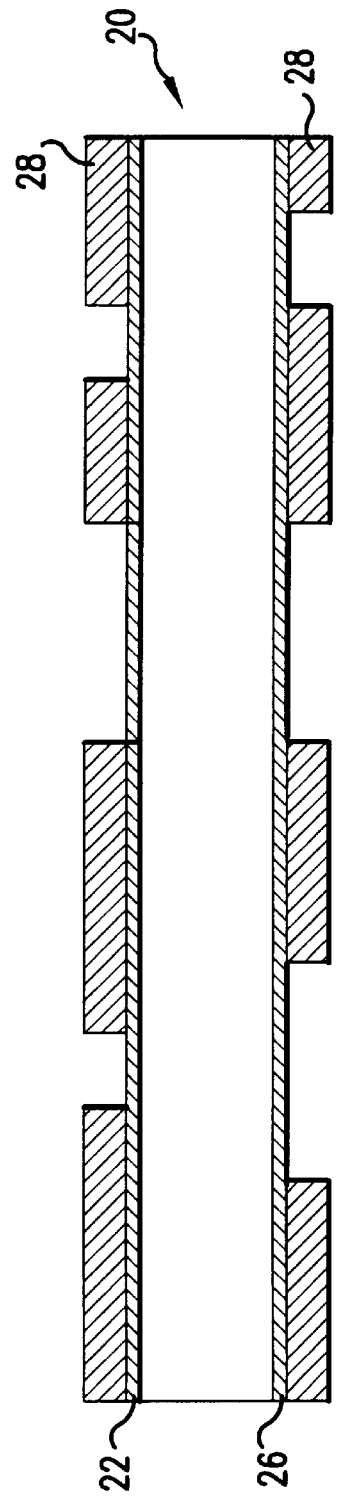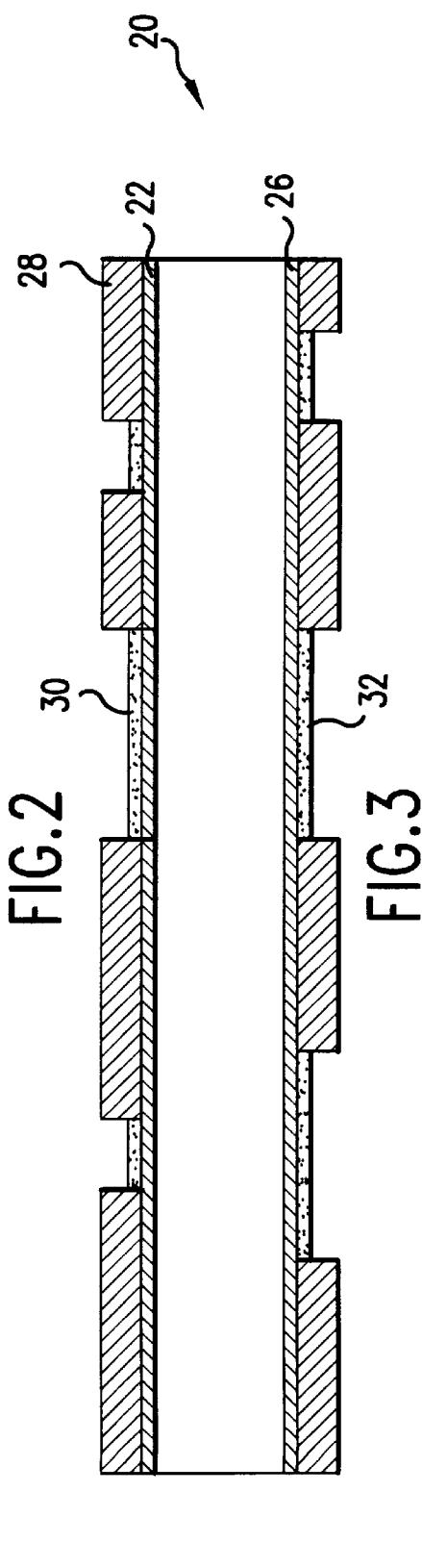

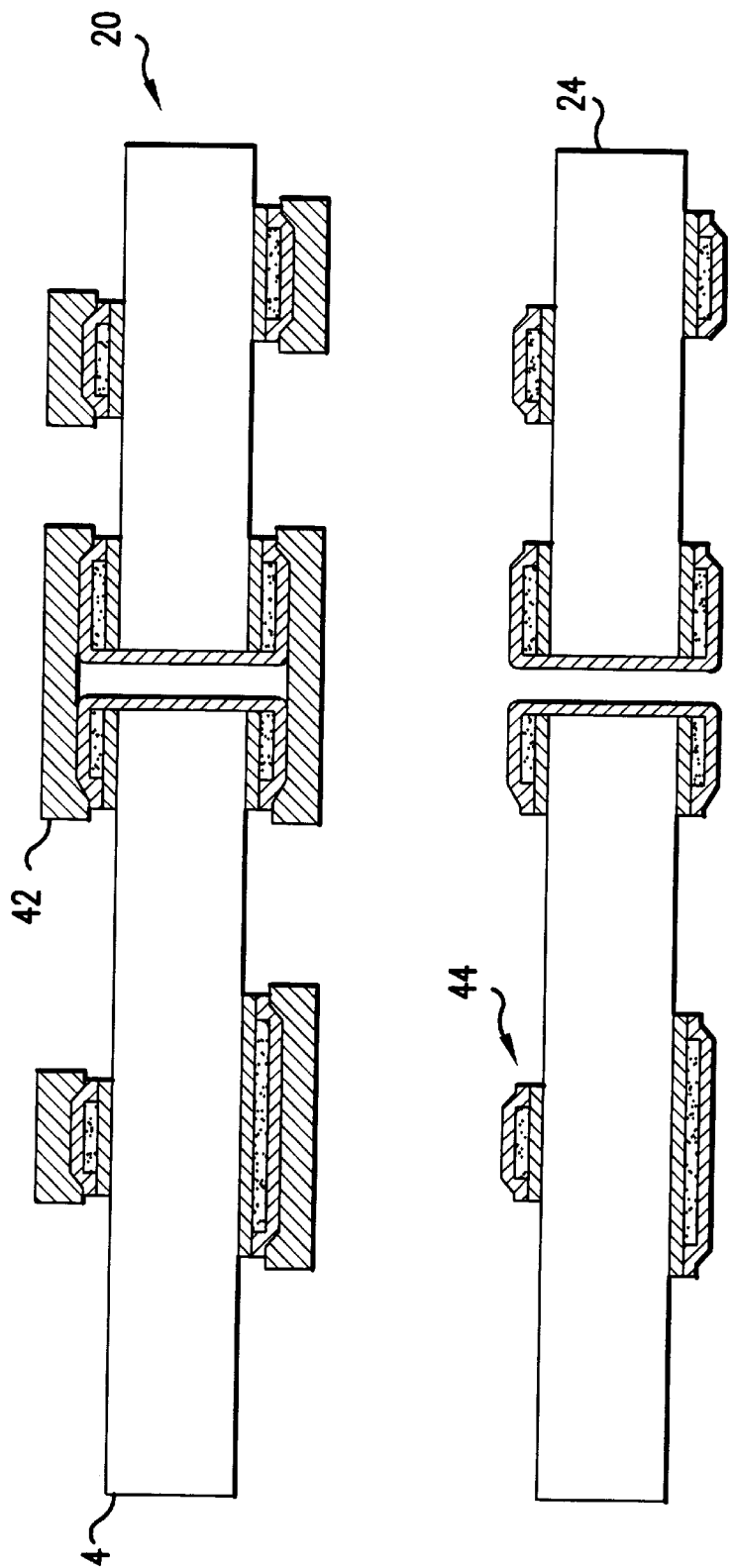

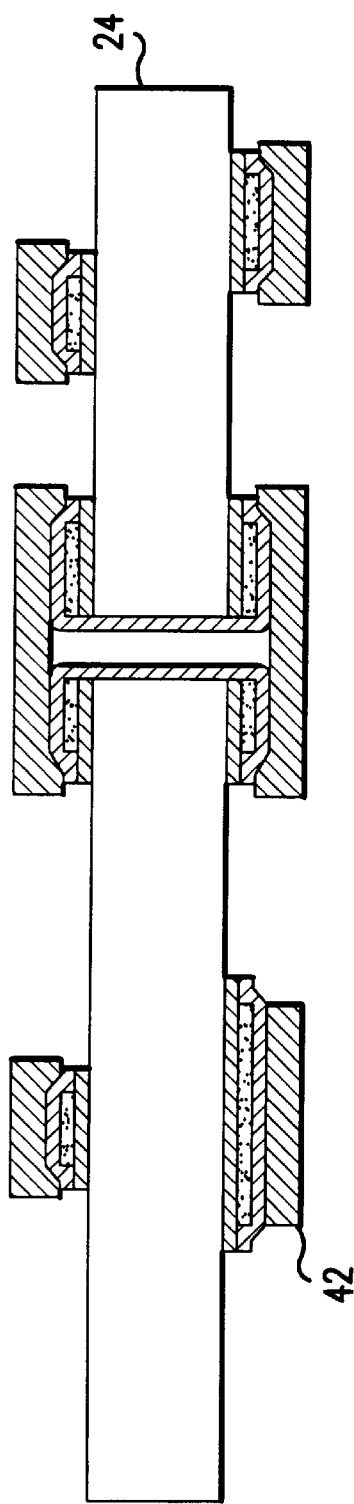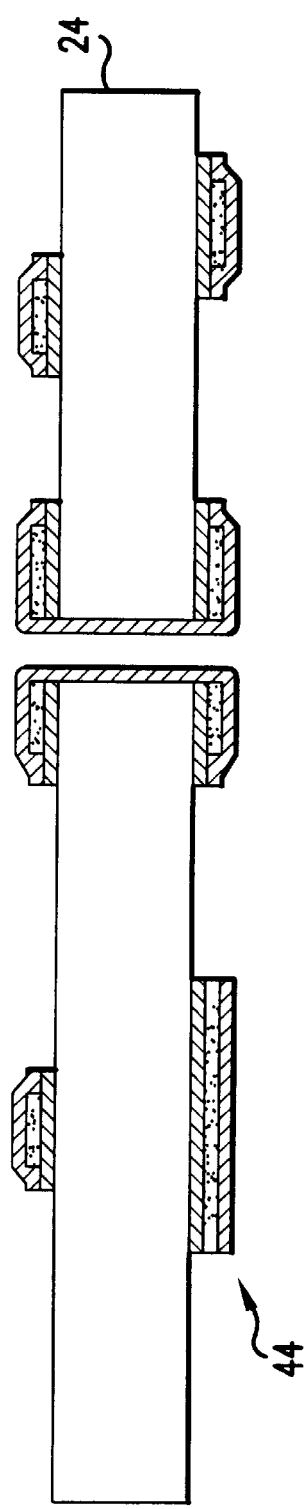

METHOD OF FORMING REDUNDANT SIGNAL TRACES AND CORRESPONDING ELECTRONIC COMPONENTS

FIELD OF THE INVENTION

The invention relates generally to fine-line signal layer formation, and more particularly to a method of forming redundant signal traces and corresponding electronic components.

BACKGROUND OF THE INVENTION

Increases in semiconductor chip input/output (I/O) in high-performance computers and other systems, and the shrinking size of consumer and automotive electronics are driving increased wiring density in single and multi-chip packages and printed wiring boards. See *Microelectronics Packaging Handbook,* 2nd edition, pp. 11–63, 11–64, and 11–117 (1997) by Tummala, Rymaszewski, and Klopfenstein. To achieve increased wiring density, the signal traces on these chip packages and printed wiring boards, and the spaces between these traces, are becoming narrower. As wiring density increases, limitations in the photolithographic processes used to define the signal traces have become apparent. These limitations manifest themselves in a decreased yield of chip packages or printed wiring boards due to defects in the signal traces.

For example, one common process for defining signal traces on chip packages, printed wiring boards, or other electronic interconnects is known as a subtractive process. In this process, a panel consisting of a copper clad dielectric material is coated with a photoimagable polymer (photoresist). A phototool containing a negative image (clear traces with a black background) of the signal trace layer to be formed is placed over the photoresist coated panel and ultraviolet (UV) light is used to expose and crosslink the photoresist through the clear areas in the phototool, which correspond to the subtractive signal image. Unexposed areas of the photoresist are then removed in a developer solution. The traces are then defined in the copper by exposing the panel to a copper etching solution, where the photoresist acts to protect the copper beneath it, while the remaining copper is removed. The photoresist is then removed to complete the process.

As signal trace widths become narrower, defects may occur in the signal traces due to a variety of factors. The presence of dirt or debris on or beneath the phototool during exposure can lead to breaks or opens in the signal traces. Poor adhesion of the photoresist to the copper, or mechanical damage to the photoresist during processing can result in similar trace opens. Both adhesion related problems and mechanical damage become more prevalent as trace widths are narrowed. Most of the defects caused by debris during the exposure process, poor photoresist adhesion, or mechanical damage have been found to occur randomly across the surface of a panel.

SUMMARY OF THE INVENTION

In the present invention, signal traces are defined in two independent steps, such that successful definition of a trace in either step results in a good, functioning trace. As a result, the frequency of randomly distributed defects is greatly reduced because the likelihood of a defect occurring at the same location in both steps is minimal.

It is a purpose of the present invention to provide a method for increasing the yield of chip packages, printed wiring boards, or other electronic interconnects by allowing for the redundant formation of signal trace layers in these interconnects.

It is another purpose of the present invention to provide a method in which a copper clad composite base substrate, which includes a dielectric core material, is coated with a photoresist to define a semi-additive signal image. A barrier layer of a conductive etch-resistant material, such as gold, is deposited on the copper cladding. The photoresist on the copper cladding is removed to form an etch-resistant barrier signal trace having a first line width. Optionally, one or more via holes can be drilled in the substrate. A surface conductive layer, such as copper, is deposited on the copper cladding, the barrier signal trace, and in the optional via holes. The substrate is coated with a photoresist to define a subtractive signal image having an opposite contrast to that of the semi-additive signal image. Portions of the surface conductive layer and the copper cladding are removed to expose the dielectric core. The photoresist is removed, thereby forming a second signal trace having a second line width, which is greater than the first line width.

Yet another purpose of the present invention is a composite-layer interconnect having redundant signal traces fabricated according to the principles of the invention.

These and other objects, advantages, and salient features of the present invention will become apparent upon reference to the following detailed description in conjunction with the accompanying drawings, which illustrate by way of example the principles of the invention.

BRIEF DESCRIPTION OF THE DRAWINGS

FIG. 1 illustrates a base substrate having a top side and a bottom side and defined by a dielectric layer interposed between a top conductive layer and a bottom conductive layer;

FIG. 2 illustrates a photoresist coating which defines a semi-additive signal image on the top and bottom sides of the base substrate depicted in FIG. 1;

FIG. 3 illustrates an etch-resistant metal deposited on the top and bottom sides of the base substrate depicted in FIG. 2;

FIG. 7 illustrates the base substrate depicted in FIG. 6 after etching to expose a portion of the dielectric layer;

FIG. 8 illustrates the base substrate depicted in FIG. 7 after the photoresist has been removed therefrom;

FIG. 9 illustrates the base substrate depicted in FIG. 6 after etching according to an alternate embodiment of the invention;

FIG. 10 illustrates the base substrate depicted in FIG. 9 after the photoresist has been removed therefrom.

DETAILED DESCRIPTION OF THE INVENTION

Figure 4:
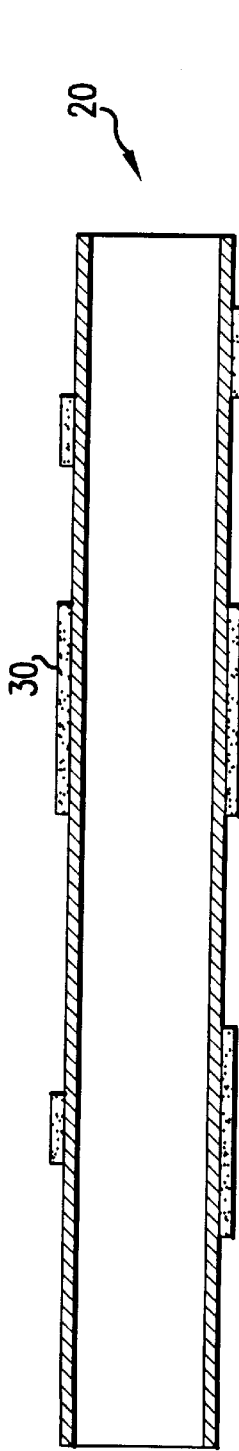
FIG. 4 illustrates the base substrate depicted in FIG. 3 after the photoresist has been removed therefrom.

The present invention provides a method of forming redundant signal traces and corresponding electronic components which increases the yield of chip packages, printed wiring boards, and other types of electronic interconnects by allowing for the redundant formation of signal trace layers in these electronic devices and interconnects. According to the principles of the present invention, signal traces are defined in two independent steps, with successful definition of a trace in either step resulting in a good trace. Accordingly, the frequency of randomly distributed defects is greatly reduced because the likelihood of a defect occurring at the same location in both steps is very small. This method substantially eliminates defects such as etch-outs and opens, facilitates the manufacture of an electronic interconnect having a high I/O, and prevents wasteful scrapping of defective panels.

With reference to the drawings, wherein similar reference characters designate corresponding parts throughout the several views, FIGS. 1–10 illustrate a process for forming a composite-layer interconnect having redundant signal traces according to the principles of the present invention.

A base substrate 20 having a top side surface and a bottom side surface is provided as shown in FIG. 1. The base substrate 20 is a laminate which includes a top conductive layer 22 (such as copper, for example) disposed on the top side surface, a layer of dielectric material 24 (i.e., a dielectric core), and a bottom conductive layer 26 (such as copper, for example) disposed on the bottom side surface. Suitable dielectric materials include but are not limited to polyimides and polyamide laminates, epoxy resins, organic materials, or dielectric materials comprised at least in part of a fluoropolymer, including homopolymers and copolymers of tetrafluoroethylene, such as polytetrafluouroethylene (PTFE). One suitable type of preferred dielectric material may be obtained from W. L. Gore & Associates, Inc., Newark, Del. under the tradename SPEEDBOARD® dielectric materials. (SPEEDBOARD is a registered trademark of W. L. Gore & Associates, Inc.)

Referring to FIG. 2, a photoresist 28 is applied to the top conductive layer 22 and the bottom conductive layer 26, respectively, and is processed in a conventional manner to define a semi-additive signal image. Openings in the photoresist 28 are thus defined on the top and bottom conductive layers, into which an etch-resistant metal, such as gold, will be deposited.

A "flash" layer of gold, or other etch-resistant metal, is then deposited by electrolytic or electroless plating, sputtering, or evaporation on both the top and bottom side of the base substrate 20, as shown in FIG. 3. The gold, or other etch-resistant metal, forms a top barrier layer 30 and a bottom barrier layer 32 on the top conductive layer 22 and the bottom conductive layer 26, respectively, of the composite base substrate 20. After deposition of the etch-resistant metal is complete, the photoresist 28 is removed from the base substrate leaving the etch-resistant barrier metal coating applied to each side of the base substrate 20 as shown in FIG. 4, thereby forming a first pattern of signal traces, which includes at least a first signal trace. Each of the signal traces in the first pattern of signal traces has a first line width.

Figure 5:
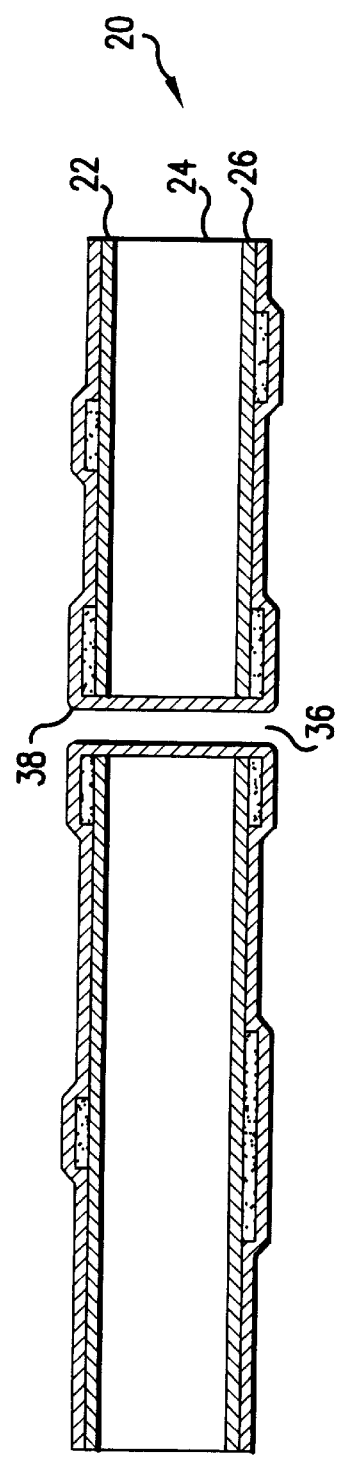
FIG. 5 illustrates plating a surface conductive layer on the base substrate depicted in FIG. 4 and a via drilled therein.

Referring to FIG. 5, one or more vias 36 are formed through the top barrier layer 30, the top conductive layer 22, the dielectric layer 24, the bottom conductive layer 26, and the bottom barrier layer 32. The via 36 may be formed with a laser in a laser ablation process. Such laser ablation may be accomplished by any laser suitable for selective ablation of the composite layers. Lasers which operate in the ultraviolet wavelengths are particularly well-suited, such as excimer lasers, and frequency tripled or quadrupled YAG lasers. However, other types of lasers are also suitable. The laser may be operated either in a scanning mode, in which the surface of the substrate is swept with a large laser spot, or in a focused beam.

Alternatively, vias can also be formed with a conventional mechanical drilling machine. Thus, the dielectric layer 24 can also include a material that is resistant to etching by a laser or plasma process, such as a glass-reinforced dielectric layer.

After the one or more vias 36 have been defined, the base substrate 20 is processed in any suitable manner which deposits a surface conductive layer 38, such as copper, on the top side of the base substrate (on the top conductive layer 22 and top barrier layer 30), along the surface presented by one or more of the vias 36, and on the bottom side of the base substrate (on the bottom conductive layer 26 and bottom barrier layer 32). The plated via 36 electrically connects the top conductive layer 22 and the bottom conductive layer 26. Suitable processes include, but are not limited to, a conventional electroless copper plating operation, sputtering, evaporation, or deposition of a conductive coating which allows direct electrodeposition, or any other equivalent process. Optionally, additional electrolytically deposited copper may be added to thicken this surface conductive layer deposit, thereby providing a more robust surface for additional process steps. FIG. 5 depicts the base substrate 20 after the via formation and the conductive deposition step.

Figure 6:
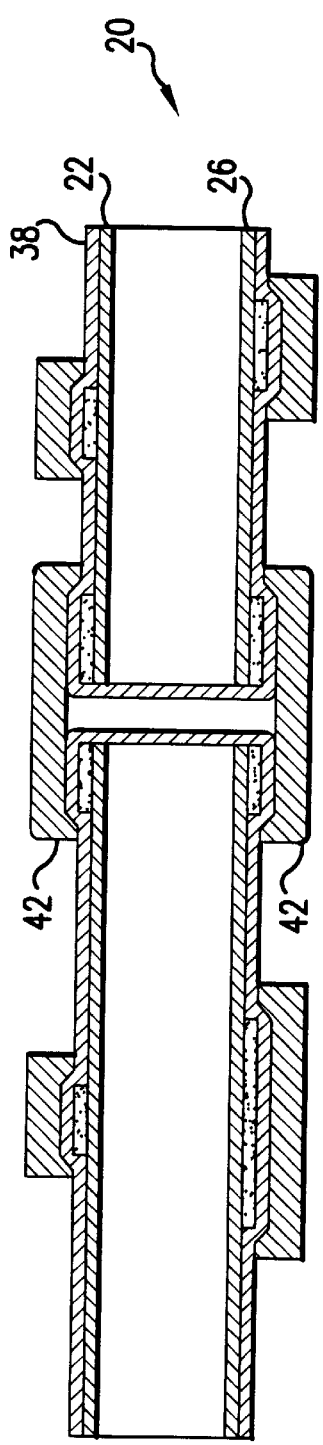
FIG. 6 illustrates a photoresist coating defining a subtractive signal image, which has an opposite contrast to that of the semi-additive signal image, on the base substrate depicted in FIG. 5.

Referring to FIG. 6, the base substrate 20 is then coated with photoresist 42 on both the top side and the bottom side thereof. The photoresist 42 is processed in a conventional manner to define a subtractive signal image. The subtractive signal image has an opposite contrast to that of the semi-additive signal image illustrated by FIG. 2. Openings are thus defined by the photoresist 42 on each of the top side (on the top conductive layer and the top barrier layer) and the bottom side (on the bottom conductive layer and the bottom barrier layer) of the base substrate 20. The pattern of the photoresist protects particular areas of the composite-layer structure corresponding to the subtractive signal image from the etchant which will be used to remove the exposed surface conductive layer 38 and top and bottom conductive layers 22, 26 on the top and bottom sides of the base substrate 20.

With the photoresist 42 in place on both the top and bottom side of the base substrate 20 as illustrated by FIG. 6, the copper in predetermined areas exposed by the overlying photoresist 42 is etched away using any suitable copper etchant to expose the dielectric layer 24 as shown in FIG. 7. The copper etchant can be, for example, a cupric chloride based etchant solution Alternately, an alkaline copper etchant including a copper ammonium complex, ammonium chloride, ammonium hydroxide, sodium chlorite, ammonium bicarbonate, ammonium phosphate, and ammonium nitrate, and commonly referred to as alkaline or ammoniacal etchant is particularly well suited.

Referring to FIGS. 7 and 8, the photoresist 42 is then removed from the top and bottom sides of the base substrate 20, thereby forming a second pattern of signal traces, which includes at least a second signal trace. Each of the signal traces in the second pattern of signal traces has a second line width, wherein the second line width is greater than the first line width according to the principles of the invention. The difference between the line width in the first pattern of signal traces and the line width in the second pattern of signal traces is designed to account for registration tolerances in aligning the second signal trace pattern to the first signal trace pattern, and to prevent the resulting final signal trace, which is redundantly formed according to the principles of the invention, from growing wider due to misregistration. The extent of the difference between the line width of the first signal trace pattern and the line width of the second signal trace pattern is determined by the maximum misregistration expected from the particular alignment process being used. For example, if it is known that the maximum pattern-to-pattern misregistration in a given process is twenty microns, and if the desired final line width (of the redundantly formed signal trace) is fifty microns, then the first signal trace line width should be made thirty microns (i.e., fifty minus twenty microns) or less. The second signal trace line width should be made fifty microns or, taking into account that the etching process may also remove some copper under the photoresist while the copper on the base substrate is being removed, an appropriate width such that the final line width will be fifty microns. FIG. 8 illustrates the base substrate 20 after the copper within the exposed areas defined by the overlying photoresist 42 has been etched away and the photoresist removed.

A composite-layer interconnect having redundant signal traces formed according to the previously described illustrative embodiment of the invention thus comprises a dielectric core 24 and a redundantly formed signal trace 44. Such redundantly formed signal trace 44 comprises a first barrier signal trace including an etch-resistant barrier, and a second signal trace overlying the barrier signal trace.

The configuration and/or dimensions of the photoresist 42 defining the subtractive signal image in FIG. 6 can be varied to control the line widths in the first pattern of signal traces and the line widths in the second pattern of signal traces. FIG. 9 shows a variation in the span of the photoresist 42 in a particular area thereof to constrain the line widths of the first barrier signal trace and the second signal trace in redundant signal trace formation. After etching and removal of the photoresist 42, the redundant signal trace layers 44 have dimensions as shown in FIG. 10.

Figure 11:
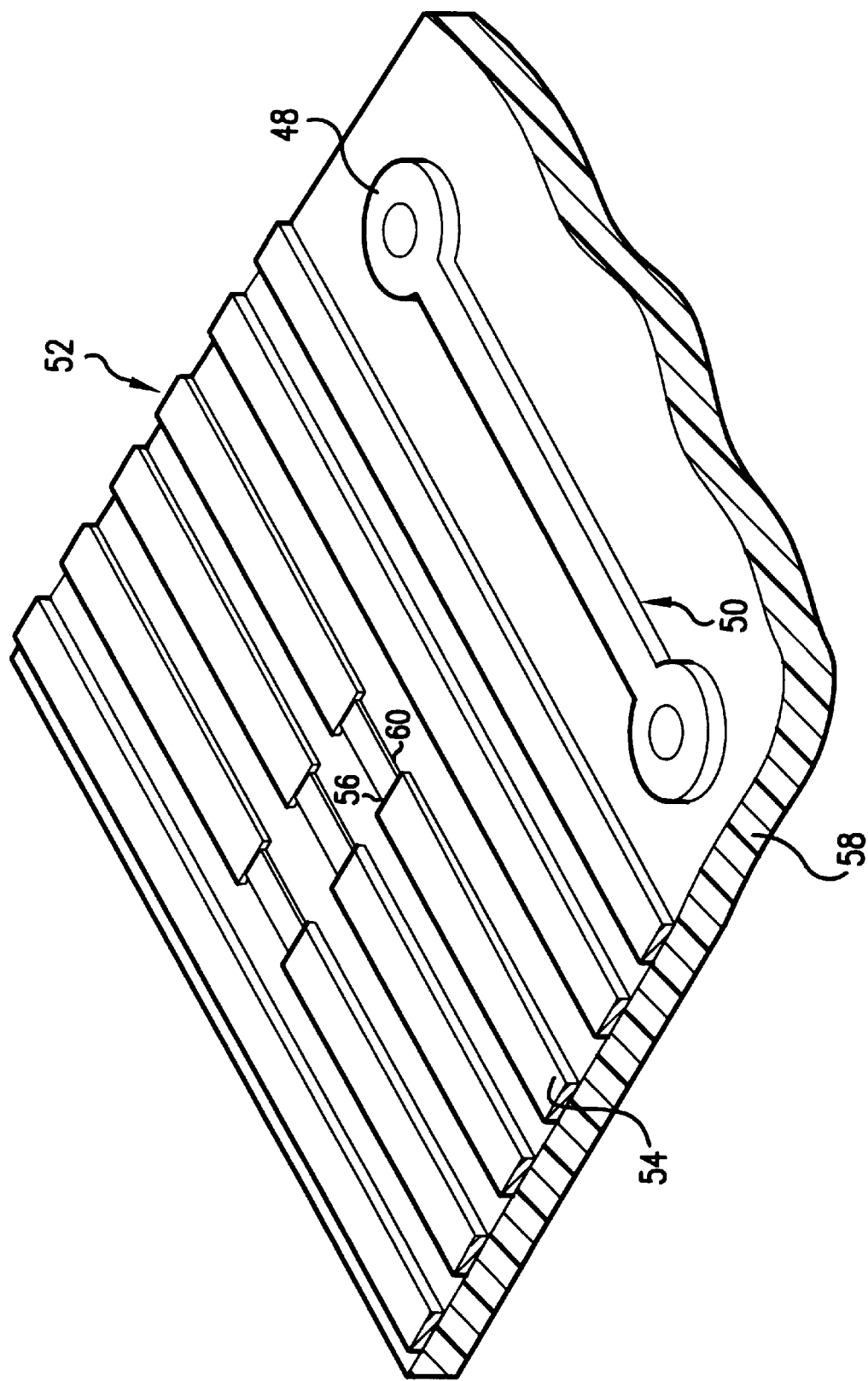
FIG. 11 illustrates a redundantly formed signal trace layer in a composite-layer interconnect according to the principles of the invention.

FIG. 11 is a perspective view of a layer of redundantly formed signal traces in a composite-layer interconnect illustrating, by way of example and not limitation, seven redundantly formed signal traces. Capture pads 48 are formed as extensions of one of the redundantly formed signal traces 50. The width of the conductor is wider at the capture pads than in the rest of the redundantly formed signal trace, which allows for misregistration of artwork to the layer.

In each redundantly formed signal trace, such as redundantly formed signal trace 52, the second signal trace 54 is disposed above the first barrier signal trace 56 with both the second signal trace and the first barrier signal trace being redundantly disposed above the dielectric core 58. The first barrier signal trace 56, which includes the etch-resistant barrier metal such as gold, is narrower than the second signal trace 54.

It is possible that dirt or debris may be caught under the photoresist or that the photoresist may be scratched during the process procedure for fabricating the interconnect so that a defect 60, such as an "open", could be created in the second signal trace 54, as shown in FIG. 11. Although a defect 60 may be formed in the second signal trace, the redundancy provided by the first signal trace therebeneath prevents an open in the combined signal trace 52. As a result, the interconnect or panel of interconnects need not be discarded.

Because the line width of signal traces in an interconnect decreases as the number and density of input/output (I/O) pins for a chip increases, a composite-layer interconnect with redundant signal traces formed therein according to the invention is useful for interconnecting with multi-chip modules (MCMs), single-chip modules (SCMs), and printed circuits in high-density I/O applications.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

What is claimed is:

1. A method of fabricating a composite-layer interconnect having redundant signal traces, comprising the following steps:

(A) forming a first barrier signal trace on at least one first conductive layer of a substrate, the first barrier signal trace including an etch-resistant metal and having a first line width;

(B) optionally forming one or more vias in the substrate;

(C) depositing a surface conductive layer on the at least one first conductive layer, on the barrier signal trace, and on a surface of the optional vias; and (D) forming a second signal trace having a second line width greater than the first line width of the first barrier signal trace.

2. The method of claim 1, wherein:
the second signal trace is formed overlying the first barrier signal trace.

3. The method of claim 1, wherein:
the etch-resistant metal is gold, nickel, silver, platinum, or combinations thereof.

4. The method of claim 1, wherein step (A) comprises the steps of:

coating a photoresist pattern on the at least one first conductive layer which defines a semi-additive signal image, depositing the etch-resistant metal on the at least one first conductive layer, and removing the photoresist thereby forming the first barrier signal trace.

5. The method of claim 4, wherein step (D) comprises the steps of:

coating a photoresist pattern on the first conductive layer which defines a subtractive signal image, the subtractive signal image having an opposite contrast to that of the semi-additive signal image, removing predetermined portions of the surface conductive layer and the at least one first conductive layer, and removing the photoresist thereby forming the second signal trace.

6. The method of claim 1, wherein: the vias are formed by laser ablation.

7. The method of claim 1, wherein:
the substrate includes a dielectric material.

* * * * *